United States Patent [19]

Smith

[11] Patent Number: 4,810,347

[45] Date of Patent: Mar. 7, 1989

[54] PENNING TYPE CATHODE FOR SPUTTER COATING

[75] Inventor: James F. Smith, Haverhill, Mass.

[73] Assignee: Eaton Corporation, Cleveland, Ohio

[21] Appl. No.: 170,753

[22] Filed: Mar. 21, 1988

[51] Int. Cl.$^4$ ............................................. C23C 14/34
[52] U.S. Cl. .................................................. 204/298
[58] Field of Search .................... 204/298 SG, 298 ME

[56] References Cited

U.S. PATENT DOCUMENTS

| | | | |
|---|---|---|---|
| 2,146,025 | 2/1939 | Penning | 204/192.12 |
| 3,884,793 | 5/1975 | Penfold et al. | 204/298 |
| 4,282,083 | 8/1981 | Kertesz et al. | 204/298 |
| 4,434,038 | 2/1984 | Morrison, Jr. | 204/192.15 |
| 4,569,746 | 2/1986 | Hutchinson | 204/298 SG |
| 4,604,180 | 8/1986 | Hirukawa et al. | 204/298 SG |
| 4,606,806 | 8/1986 | Helmer | 204/298 SG |
| 4,629,548 | 12/1986 | Helmer | 204/298 |

Primary Examiner—Aaron Weisstuch
Attorney, Agent, or Firm—Watts, Hoffmann, Fisher & Heinke

[57] ABSTRACT

A sputter coating system utilizing a Penning type cathode. Inner and outer targets are concentrically oriented about an axis that intersects a substrate spaced from the targets. An electromagnet produces a magnetic field in a region between the substrate and the targets that confines a plasma of ions relative the targets. An annular anode that separates the two targets helps create an electric field that accelerates ions from the plasma to the targets where collisions between the ions and targets cause target material to sputter coat the substrate.

10 Claims, 6 Drawing Sheets

PENNING TYPE CATHODE FOR SPUTTER COATING

FIELD OF THE INVENTION

The present invention relates to a sputter coating cathode for coating a substrate and more particularly relates to a Penning type sputter cathode.

BACKGROUND ART

One proposed fabrication technique for coating rigid magnetic disk memories is to sputter a ferro-magnetic material from a target onto a substrate to a controlled thickness and uniformity. This sputter coating is accomplished in an evacuated chamber having a controlled concentration of ionizable gas. Electrons moving in a confined region due to a magnetic field in the chamber ionize the gas in regions above the target and an electric field accelerates the charged ions toward the target with sufficient momentum to cause target material to be ejected when the ions collide with the target.

Other than ferro-magnetic materials can be used for sputter coating. Integrated circuits can, for example, be fabricated by sputtering a conductive layer or layers from a target onto a non-conductive substrate and then selectively etching the one or more conductive layers.

U.S. Pat. No. 4,629,548 to Helmer entitled "PLANAR PENNING MAGNETRON SPUTTERING DEVICE" discloses a Penning cathode for sputtering a material onto a substrate positioned relative to the cathode. Unlike a more conventional magnetron cathode, a Penning type cathode uses a cathode/anode structure and magnet combination that results in the magnetic field lines intersecting the cathode sputtering surface at generally right angles. If an ionizable gas in sufficient quantity is present in the vicinity of the cathode this causes ionizing electrons to spiral in the magnetic field and ionize the gas atoms. The charged gas ions are attracted to the cathode and impact the cathode to sputter off cathode material that then coats the substrate.

In the Helmer patent, two sputtering cathode targets and a single anode are spaced symmetrically about a center axis passing through an inner one of the cathode targets. As disclosed in FIG. 4 of the Helmer patent, the sputter surfaces of the two cathode targets are, at least initially, approximately co-planar. A thin cylindrical anode separates the two targets and extends beyond the co-planar surface of the targets to intersect the "lie of sight" co-planer surface shared by the two cathode targets.

FIG. 3 of the Helmer patent is a graph of current versus voltage for different anode configurations and as indicated in this graph, the voltage applied to the target material becomes essentially independent of the current at high voltages. FIG. 5 suggests that this independence between current and voltage is also experienced at different gas pressures. Since the measured current on the target is an indication of target erosion rate due to ion bombardment of the target, the Helmer construction results in a system wherein target erosion and therefore coating rate cannot be controlled (at least at high currents) by modifying the target potential.

DISCLOSURE OF THE INVENTION

The present invention relates to a Penning type cathode construction that is believed to have superior sputter coating characteristics to a cathode constructed in accordance with the teaching in the prior art '548 patent to Helmer. Target utilization during sputter coating is greater and control over coating uniformity can be more easily maintained.

In accordance with a preferred embodiment of the invention, the coating apparatus includes a first consumable cathode target having a generally planar, circular emitting surface which is oriented generally parallel to a substrate coating plane. Radially outward from this first planar emitting surface or target is an annular anode which helps set up an electric field for attracting ionized gas atoms to the target. A second consumable target located radially outward from the center target has a sputter surface angled with respect to the coating plane.

The combination of the two targets and the anode form a concave structure bounding the vicinity of gas ionization. Ionization is concentrated in regions defined by a magnet which sets up magnetic fields having lines of force which intersect the inner and outer targets. This magnetic field orientation causes ionizing electrons to spiral along the field lines thereby creating regions of concentrated gas ionization. The ions are attracted to the two targets due to the electric field set up between the anode and cathode targets.

The anode has an inclined ring surface facing the plane of the substrate which does not disrupt "line of sight" interaction between the two cathode targets. By adjustment of the magnetic field lines in the region between target and substrate, it is possible to better utilize the cathode target material. In addition, the coating rate can be easily controlled since the sputtering ionization current of the disclosed cathode is sensitive to the bias between cathode and anode.

In accordance with a preferred embodiment of the invention, the supporting structure for the sputter cathode includes magnetic pole pieces which define a magnetic field that can be adjusted by controlling current in an electromagnetic coil mounted coaxial with the magnetic pole pieces. By adjusting the current through this electromagnetic coil, the field strength in the vicinity of the inner and outer targets is controlled. The preferred cathode construction results in a stronger magnetic field above the inner target than the inclined annular target. Although the magnetic field is preferably created using magnetic pole pieces and a current carrying coil, permanent magnets alone can also be used to generate a gas ionizing magnetic field.

From the above, one object of the invention is the use of a Penning type sputter cathode having targets for sputter coting a substrate. This and other objects, advantages and features of the invention will become better understood from a detailed description of a preferred embodiment of the invention which is described in conjunction with the accompanying drawings.

BEST MODE FOR CARRYING OUT THE INVENTION

Figure 1:
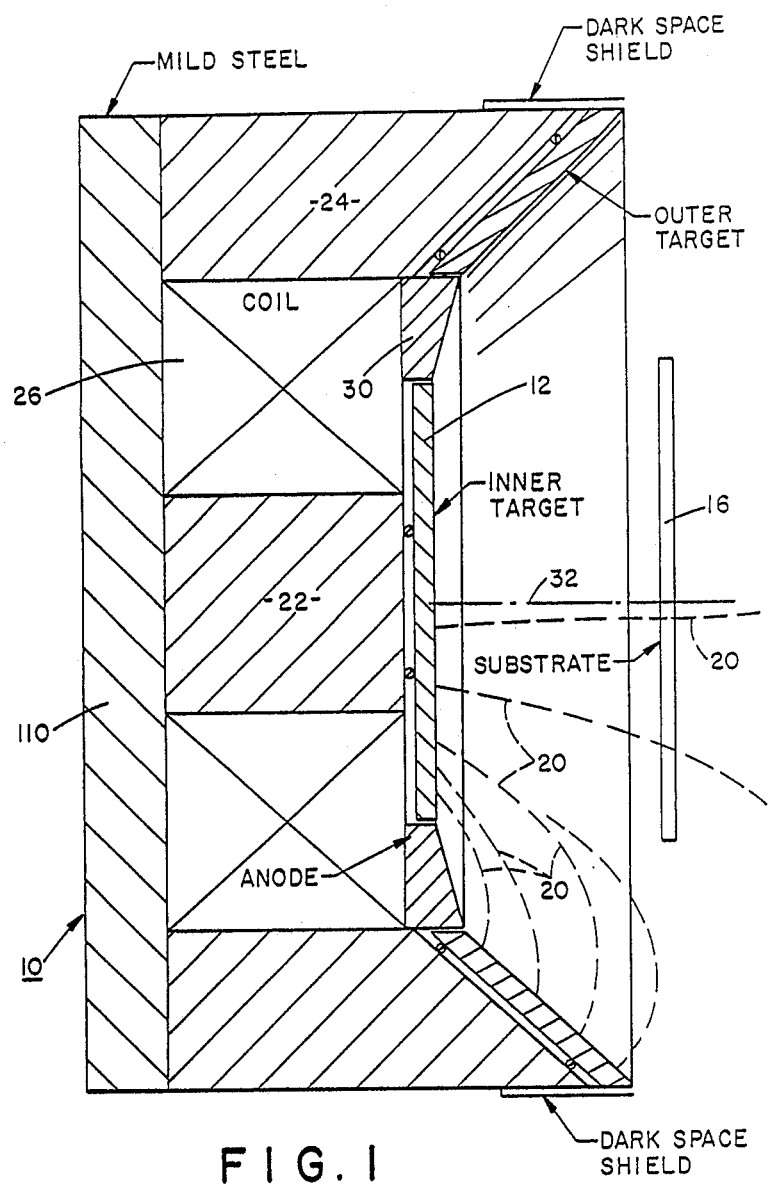
FIG. 1 is a schematic of a Penning type sputter coating cathode constructed in accordance with the invention.

Turning now the drawings, FIG. 1 is a schematic depiction of a sputter coating system 10 having two targets 12, 14 positioned relative to a substrate 16 for coating the substrate. A magnetic field that is depicted in FIG. 1 by magnetic lines of force 20 concentrates ionization of a gas (argon for example) which is introduced into a chamber 11 defined in part by the targets 12, 14.

The magnetic field lines of force 20 shown in FIG. 1 are generated by ferromagnetic pole pieces 22, 24 and the magnetic field contribution from an electromagnetic coil 26 that circumscribes a center pole piece 22. Current through the coil 26 as well as the sense of energization of the coil can be controlled by a power supply (not shown) coupled to the electromagnetic coil 26.

Separating the two targets 12, 14 is an annular anode 30 electrically isolated from the two targets 12, 14 to help define an electric field for accelerating the ionized gas atoms to impact the suface of the two targets 12, 14 facing the substrate 16. This ion bombardment causes target material to break loose from the targets and travel to the substrate, coating the substrate to a desired thickness. Such coating processes are used in fabricating integrated circuits and also used in coating magnetic computer disk memories.

The two targets 12, 14, the anode 30, and the substrate are all oriented symmetrically about a center axis 32 intersecting the center target 12. The target surface of the inner target facing the substrate is initially generally planar and the surface of the outer target forms a section of a cone. These surfaces erode in patterns that are to a great extent controlled by the magnetic field configuration in the region between the substrate 16 and the targets 12, 14. By modifying current passing through the coil 26 the magnetic field configuration is adjusted to modify target erosion at the two targets 12, 14. The coil 26 is energized to create magnetic field lines 20 that connect the inner and outer targets 12, 14 without intercepting the anode 30. If the field lines intercept the anode, trapped ionizing electrons spiralling within the magnetic field will impact the anode 30 and be lost. This reduces the ionizing efficiency of the cathode. As seen from FIG. 1, since the magnetic field lines 20 are bowed out next to the anode 30 the anode field defining surface could even be slightly convex without intercepting significant numbers of ionizing electrons. Thus, the statements concerning "line of sight" disruption between targets must be interpreted in view of the reason for this requirement.

Figure 2:
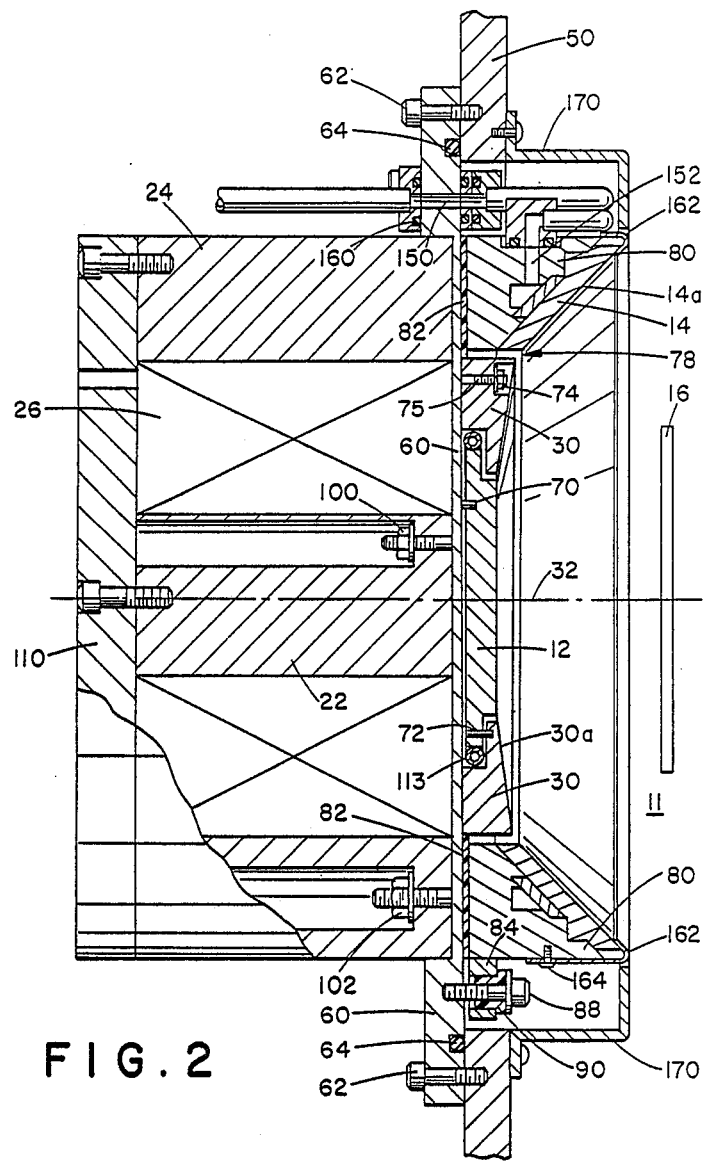
FIG. 2 is a section view of a Penning type cathode depicted schematically in FIG. 1.

Turning now to FIG. 2, a section view of the sputter coating system 10 schematically depicted in FIG. 1 is mounted to a process chamber wall 50 defining a generally circular opening to accommodate mounting of the targets 12, 14.

A substrate platen (not shown in the drawings) supports the substrate in a generally vertical orientation and serves to isolate the region between the substrate 16 and targets 12, 14. In use, a controlled plasma of gas ions is formed in the chamber 11 between the substrate 16 and the targets 12, 14 by magnetic field confinement of ionizing electrons.

most clearly in FIG. 2, a cathode support 60 is coupled to the chamber wall 50 by threaded connectors 62 passing through the support 60 to engage the process chamber wall 50. The environment within the process chamber 11 is isolated by an O-ring seal 64 supported by a groove machined into the cathode support 60. The support 60 is electrically grounded and is a non-magnetic material, preferably stainless steel of a minimum thickness to minimize the reluctance or magnetic resistance of the magnetic circuit created in the vicinity of the targets.

The two targets 12, 14 are maintained at a negative potential of approximately 400 volts. Since the targets 12, 14 are electrically isolated from each other, the negative voltage need not be and typically is not the same. An inner target 12 is electrically isolated from the support 60 by three electrically insulating spacer elements 70 that maintain a small gap between the center target 12 and the cathode support 60. The spacers 70 are threaded and engage corresponding threaded openings in the target 12 to support the target 12 in the vertical orientation shown in FIGS. 1 and 2.

The inner target 12 is generally circular in plan and constructed of iron, aluminum, or other suitable material for coating a substrate. The anode 30 is spaced from the inner target 12 by a second set of threaded insulators 72 which electrically isolate the anode and inner target 12 and in addition, help support the target 12 in a spaced configuration from the support 60.

A field defining surface 30a of the anode 30 is inclined relative to the substrate 16 and forms an annular portion of a generally concave cathode facing the substrate. A preferred angle between the anode surface 30a and the vertical oriented surface of the target 12 is approximately 15°. The anode 30 is coupled to the support 60 by four equally spaced threaded connectors 74 that engage studs 75 attached to the support 60. These connectors 74 are recessed beneath the field defining surface 30a in cylindrical cavities 76 to reduce the effect of the connectors 74 on the ion accelerating electric field in the vicinity of the anode 30.

Figure 3:
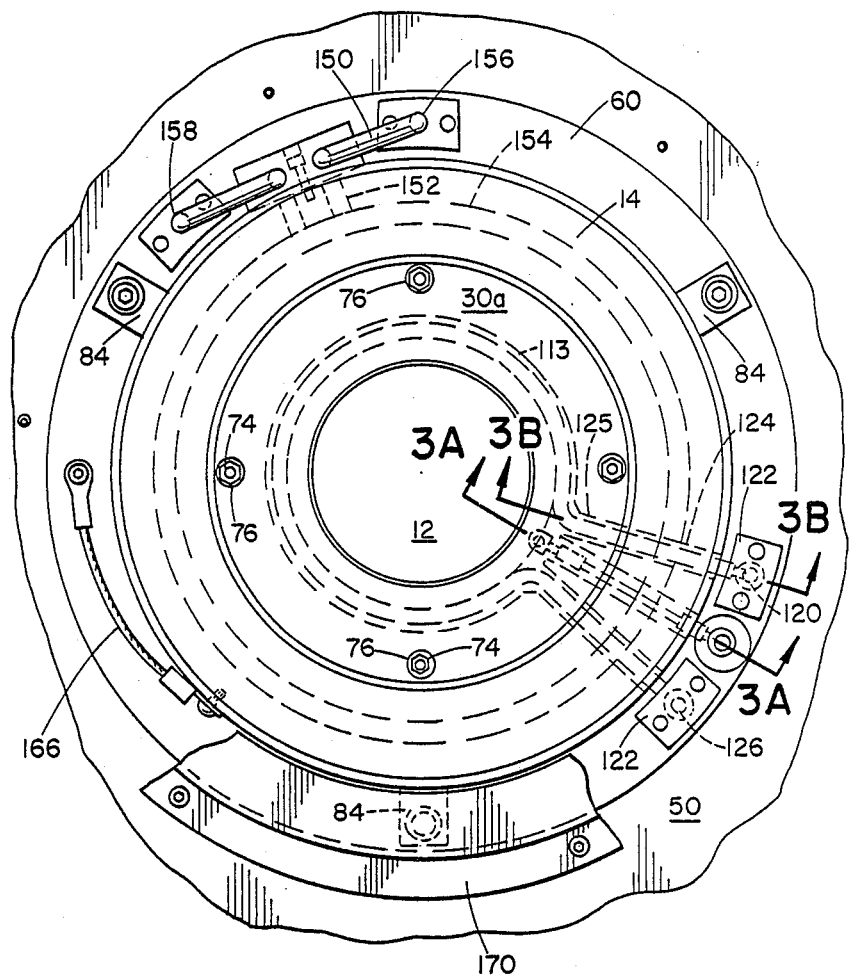
FIG. 3 is a plan view of the Penning type cathode of FIG. 2.
Figure 3A:
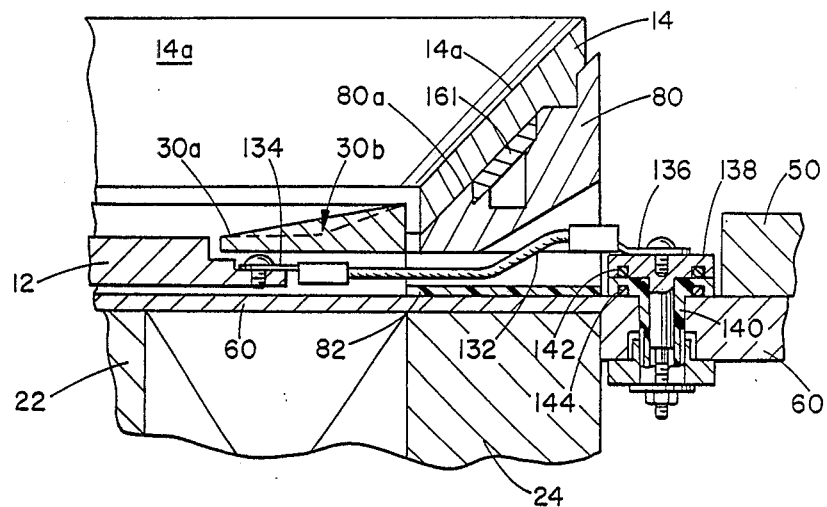
FIGS. 3A and 3B are section views as seen from the planes of the lines 3A—3A and 3B—3B in FIG. 3.

The section view of FIG. 3A illustrates both a preferred anode surface 30a and an alternate notched anode surface 30b. In the notched configuration an inner portion of the anode surface 30b is substantially co-planar with an outwardly facing surface of the inner target 12. The anode surface 30b then angles out toward the substrate to a point where the preferred and alternate anode configurations meet.

The outer target 14 is spaced from the anode 30 by a small circular gap 78 which electrically separates the outer target 14 from the anode 30. A second target support 80, constructed of mild steel to extend the pole piece 24, has a support surface 80a angled with respect to the planar substrate at an angle of approximately 45°. The target 14 initially defines a sloped material emitting surface 14a which forms the 45° angle with respect to both the substrate 16 and the center target 12.

The second support 80 is spaced from the grounded support 60 by an insulating ring 82, outwardly extending flanges 84 extend from the outer periphery of the support 80 and define three equally spaced openings to accommodate threaded connectors 88 that fix the support 80 to the support 60. Since the support 80 is biased at the negative potential of the outer target 14 an insulating washer 90 separates the grounded connector 88 from the support flange 84.

As seen most clearly in FIG. 2, the magnetic pole pieces 22, 24 are symmetrically arranged with respect to the center axis 32 and coupled to the support 60 by connectors 100, 102. The pole pieces 22, 24 are preferably constructed from mild steel. A concentrically wound electromagnetic coil is supported by the center pole piece 22 and electrically energized to modify the magnetic field in the chamber 10. This coil is coupled to a power supply (not shown) by conductors passing through a magnet end piece 110 fixed to the magnet pole pieces 22, 24. In a preferred embodiment of the invention, the electromagnetic coil is a continuous multiple turn coil supported on a mandrel fixed within the gap between magnet pole pieces 22, 24.

During operation of the Penning type cathode disclosed in FIGS. 2 and 3, the two targets 12, 14 are bombarded by high energy ions and absorb heat energy from those ions. To cool the center target 12, a coolant (preferably water) is brought into thermal contact with the target.

Figure 3B:
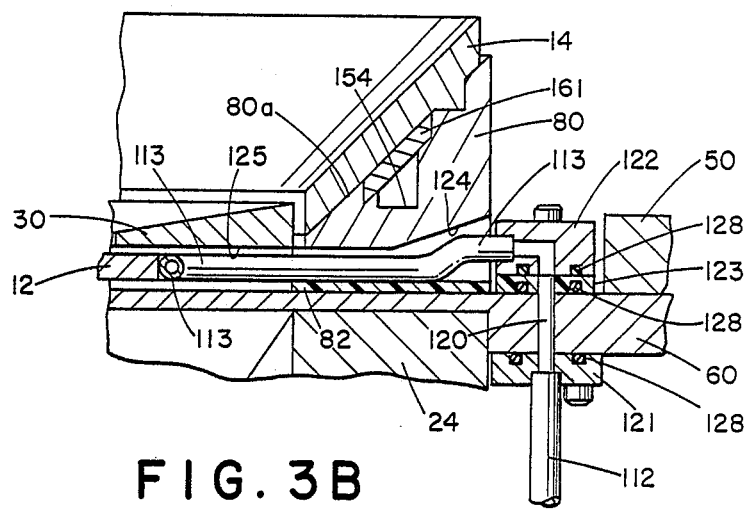

A conduit 112 delivers coolant to an entrance passageway 120 (FIG. 3B) in the support via an inlet coupling 121. A second conduit 113 engages a second coupling 122 spaced from the support 60 by an insulating washer 123. The conduit 113 is routed through passageways 124, 125 in the outer target support 80 and anode 30 respectively. The conduit 113 is bent in the form of a loop or coil that nearly surrounds and contacts an outwardly facing surface of the center target 12. The anode 30 and support 80 also define passageways to route the conduit 113 through the anode 30 and support 80 to an exit passageway 126 through the support 60 where coolant heated by the center target 12 is routed away from the chamber 11. To maintain chamber isolation "O" rings 128 surround the entrance and exit passageways 120, 126. These "O" rings 128 fit within grooves in the couplings 121, 122 and washer 123.

As seen most clearly in FIG. 3A, the center target 12 is biased at a controlled negative voltage of approximately 400 volts d.c. by an insulated conductor 132. An electrical connector 134 couples the conductor 132 to the target 12 and a second electrical connector 136 is coupled to a connector 138 that passes through the support 60. Electrical isolation between this negative voltage carrying connector 138 and the support 60 is maintained by an insulating washer 140 that spaces the connector 138 from the support 60. Chamber isolation is maintained by "O" ring seals 142, 144 between the connector 138 and washer 140 and the washer 140 and support 60.

A second conduit 150 carries a coolant into thermal contact with the second outer target 14 by directing the coolant through a entryway 152 machined in the support 80 leading to an annular channel 154 machined in the support 80 that directs the coolant (preferably water) through the support 80 to absorb and carry away accumulated heat due to ion bombardment of the target 14. Both an entry 156 and exit 158 passageway in the support 60 for routing the conduit 150 into and out of the chamber 11 are sealed with "O" ring seals 160 to maintain process chamber isolation. The support 80 is fabricated by machining the channel 154 into the body of the support 80 from the support surface 80a and then welding a steel insert 161 to the support 80 to form an enclosed annular channel within the support 80.

The outer target 14 is fixed to the support 80 by clips 162 that overlie the target 14 at spaced locations and are connected to the support 80 by threaded connectors 164 which are removed during target replacement. An insulated conductor 166 is routed into the support 60 and electrically connected to an outer surface of the target 14. This allows the outer target 14 to be biased differently from the inner target 12.

A shield 170 spaced from the outer target 14 impedes material sputtered from the targets 12, 14 from coating the target cooling and biasing structure. As seen most clearly in FIG. 2, subsequent to target sputtering, the support 60 can be removed, leaving the outer shield 170 attached to the wall 50. The two targets 12, 14 are then replaced and the support 60 is re-installed.

Figure 4:
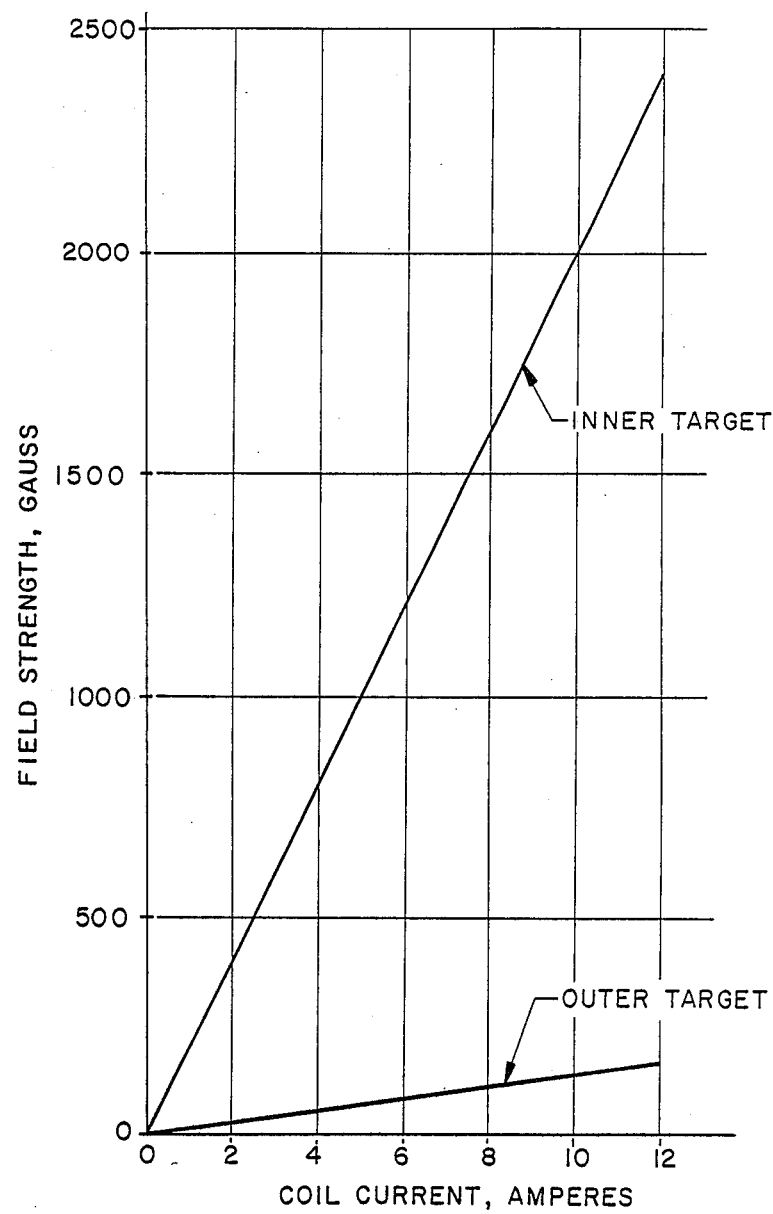
FIG. 4 is a graph showing magnetic field strengths in the vicinity of inner and outer targets as those strengths vary with electromagnetic coil energization.

The magnetic field lines depicted in FIG. 1 are obtained with a coil current of 10 amperes. Field strength values measured immediately above the inner and outer targets 12, 14 are shown versus coil current in FIG. 4. As can be seen from FIG. 1, each field line emanating from the outer target intersects the inner target although some field lines leaving the inner target do not terminate on the outer target. Sputtering from the inner target 12 takes place predominantly from the planar area containing magnetic field lines common with the outer target 14.

Figure 5:
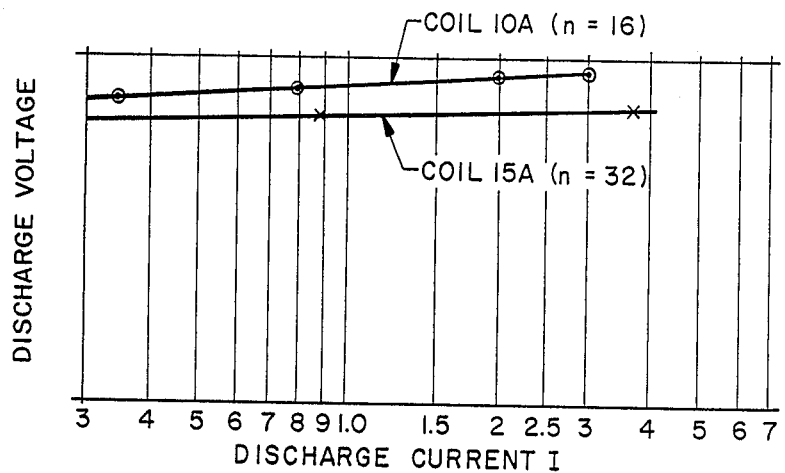
FIG. 5 is a graph showing target discharge voltage versus target discharge current for different field strengths in the vicinity of the targets; and, FIG. 6 is a graph showing aluminum material coating uniformity on a substrate utilizing a Penning type cathode structure constructed in accordance with the invention.

Curves of discharge voltage, V, versus discharge current, I, are given in FIG. 5 for two different coil currents. The electrical behavior of sputtering cathodes is normally described by an equation of the form $I = KV^n$ where k is a constant and n is an exponent which is typically between 5 and 9 for a prior art magnetron cathode. The higher values of n, viz. between 16 and 32, obtained with the Penning arrangement of the invention indicate superior electron confinement.

It is desirable to be able to independently control the power applied to the two sputtering targets 12, 14 in order to optimize film thickness uniformity. Table I (below) shows examples of the power splitting achieved with a coil current of 10A and an argon pressure of $5 \times 10^{-3}$ Torr. The target material is aluminum. Clearly, a considerable range of power ratios is available while maintaining reasonable target voltages.

TABLE I

| INNER TARGET | | | OUTER TARGET | | |
|---|---|---|---|---|---|
| POWER (KWATTS) | VOLTAGE (VOLTS) | CURRENT (AMPS) | POWER (KWATTS) | VOLTAGE (VOLTS) | CURRENT (AMPS) |
| 0.2 | 308 | 0.62 | 1.2 | 606 | 1.94 |
| 0.4 | 468 | 0.84 | 1.2 | 450 | 2.60 |
| 0.6 | 656 | 0.90 | 1.2 | 427 | 2.74 |

Figure 6:
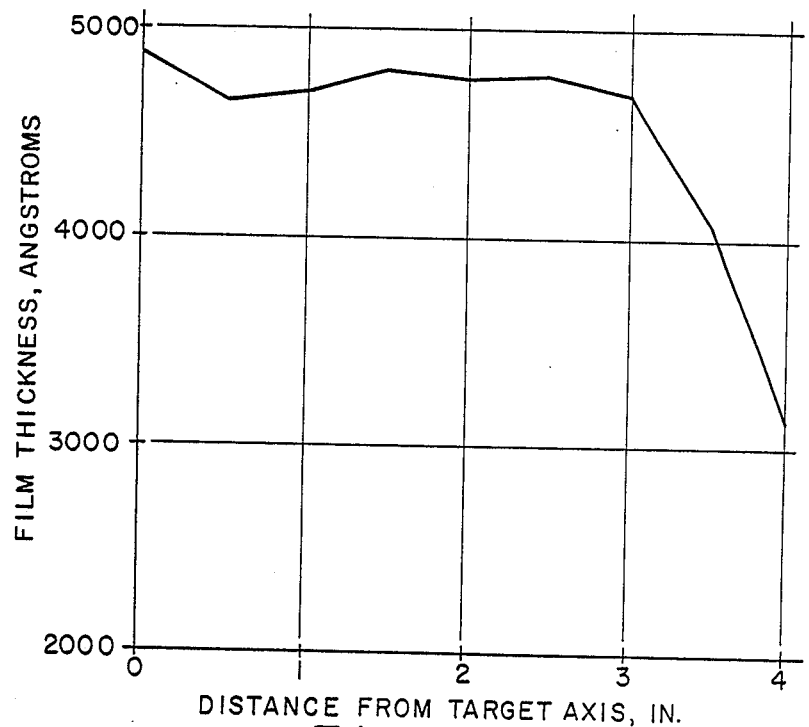

A graph of aluminum film thickness versus radial distance from the target axis is presented in FIG. 6. Substrates were placed at a distance of 2.44" from the surface of the inner target. The power applied to the inner target was 0.6 kW and that applied to the outer target was 1.6 kW. From the curve, a film thickness uniformity of ±2.2% was achieved across the inner 3" radius. This zone corresponded to a 6" diameter concentric substrate. Also from the curve, it can be seen that the average deposition rate was approximately 4,750 A/min with a total power of 2.2 kW.

One important consideration is material transfer efficiency, i.e., the proportion of sputtered material actually arriving on the substrate. The efficiency for the coating of FIG. 6 was at least 45%, i.e., significantly higher than is normally achieved with conventional magnetron sputtering targets.

Magnetron sputtering targets generally develop deep, relatively narrow erosion grooves which affect both thickness uniformity and target independence. Although only a limited amount of material was sputtered using the present cathode, it appeared that erosion occurred from broader areas than is usually the case.

The FIG. 6 data was obtained using aluminum targets. Ferro-magnetic targets can also be used. It is the intent that although one embodiment of the invention has been described with a degree of particularity, that the invention encompass all modifications and alterations from the disclosed design falling within the spirit or scope of the appended claims.

I claim:

1. Apparatus for coating a substrate comprising:
   (a) a first consumable cathode target having a generally planar, circular material emitting surface oriented generally parallel to and spaced from a coating plane for sputtering material onto a substrate surface substantially coincident with said coating plane;
   (b) an annular anode that borders an outer periphery of the first consumable cathode target and defines an electric field defining surface inclined toward said substrate plane;
   (c) a second consumable cathode target having an annular ring shaped material emitting surface inclined at an angle with respect to said coating plane for sputtering material onto the substrate surface at the coating plane;
   (d) field creating means for creating a magnetic field in a region between the coating plane and the first and second consumable cathode targets to confine ionizing electrons in said region between the coating plane and the first and second cathode targets;
   (e) support means for positioning said anode and said first and second consumable cathode targets in concentric relation about an axis that intersects both said first consumable cathode target and said coating plane; and
   (f) energization means for electrically biasing said anode and said first and second consumable cathode targets at individually controllable bias potentials to control material coating distributions on said substrate surface during sputtering of target material from said circular and inclined material emitting surfaces.

2. The sputter coating apparatus of claim 1 wherein said field creating means comprises an electro magnet for generating a magnetic field wherein magnetic field lines intersect both said first and second consumable cathode targets at generally right angles to trap ionizing electrons above said circular and inclined material emitting surfaces.

3. The sputter coating apparatus of claim 1 wherein the electric field defining surface of said annular anode is inclined with respect to said generally planar, circular material emitting surface and forms an angle with the circular emitting surface that is less that the angle between the inclined material emitting surface of said second consumable cathode target and said generally planar, circular material emitting surface.

4. The sputter coating apparatus of claim 1 wherein the first and second consumable targets are constructed from a ferro-magnetic material.

5. The apparatus of claim 1 where the electric field defining surface of the anode forms a uniform angle with a substrate coating plane from a point adjacent said first consumable cathode target to a point adjacent the second consumable cathode target.

6. The apparatus of claim 1 where the electric field defining surface of the anode is notched to form a first planar portion substantially co-planar with the first consumable cathode target and a second portion angled with respect to a substrate coating plane.

7. The apparatus of claim 1 wherein the electric field defining surface of the anode is slightly convex but does not significantly disrupt movement of ionizing electrons in the region between the coating plane and the first and second cathode targets.

8. Apparatus for coating a substrate comprising:
   (a) a first consumable cathode target having a generally planar material emitting surface oriented generally parallel to and spaced from a coating plane for sputtering material onto a substrate surface substantially coincident with said coating plane;
   (b) an anode that borders an outer periphery of the first consumable cathode target and defines an electric field defining surface inclined toward said substrate plane;
   (c) a second consumable cathode target spaced radially outward from the anode having an inclined material emitting surface that borders an outer periphery of said anode and that is inclined at an angle with respect to said coating plane for sputtering material onto the substrate surface at the coating plane;
   (d) field defining means for establishing a magnetic field in a region between the coating plane and the first and second consumable cathode targets to confine ionizing electrons in said region between the coating plane and the first and second cathode targets;
   (e) support means for positioning said anode and said first and second consumable cathode targets in symmetric relation about an axis that intersects a center region of said first consumable cathode target and said coating plane while electrically isolating the anode from said first and said second consumable cathode targets; and
   (f) energization means for electrically biasing said anode and said first and second consumable cathode targets at individually controllable bias potentials to control material coating distributions on said substrate surface during sputtering of target material from said planar and inclined material emitting surfaces.

9. The apparatus of claim 8 wherein the support means comprises a planar conductor element biasing the anode at a reference potential and first and second insulating spacer elements supporting the two consumable cathode targets in spaced relation to the planar conductor element, and wherein said field defining means comprises a ferro-magnetic support between one of said insulating spacer elements and said second consumable cathode target.

10. The apparatus of claim 8 further comprising a shield radially outward from the second consumable cathode target for intercepting material sputtered from said first and second cathode targets.

* * * * *